United States Patent [19]

Lillis et al.

[11] Patent Number: 4,651,132

[45] Date of Patent: * Mar. 17, 1987

[54] ANALOG TO DIGITAL CONVERTER SYSTEM FOR APPLICATION TO PULSE CODE MODULATION

[75] Inventors: William J. Lillis; Jimmy R. Naylor, both of Tucson, Ariz.

[73] Assignee: Burr-Brown Corporation, Tucson, Ariz.

[*] Notice: The portion of the term of this patent subsequent to Jan. 28, 2003 has been disclaimed.

[21] Appl. No.: 736,400

[22] Filed: May 20, 1985

Related U.S. Application Data

[63] Continuation of Ser. No. 351,500, Feb. 23, 1982, abandoned.

[51] Int. Cl.$^4$ ............................................. H03M 1/38
[52] U.S. Cl. ..................... 340/347 AD; 340/347 DA; 340/347 CC; 340/347 M
[58] Field of Search ... 340/347 M, 347 AD, 347 DA, 340/347 CC

[56] References Cited

U.S. PATENT DOCUMENTS 4,292,625  9/1981  Schoeff ........................ 340/347 DA

OTHER PUBLICATIONS

The Engineering Staff of Analog Devices, Inc., Analog–Digital Conversion Handbook, 6/1972, pp. II–46 to II–48; II–80 to II–87; II–32 to II–35; II–50 to II–52.

Primary Examiner—T. J. Sloyan
Attorney, Agent, or Firm—Harry M. Weiss & Associates

[57] ABSTRACT

A digital audio system for high-fidelity replication of wideband audio material. The system comprises a high-speed, low-noise and low-distortion, digital-to-analog converter including means for reducing spurious switching currents in the reconstructed audio signal. Such a converter is employed in both the encoding and decoding portions of the system.

1 Claim, 7 Drawing Figures

ANALOG TO DIGITAL CONVERTER SYSTEM FOR APPLICATION TO PULSE CODE MODULATION

This application is a continuation of application Ser. No. 351,500, filed 2/23/82, now abandoned.

CROSS REFERENCE TO RELATED APPLICATION

This application is related to the copending application "A Circuit for Improving the Performance of Digital to Analog Converters" filed on even date herewith by the inventors hereof.

BACKGROUND OF THE INVENTION

1. Field of the Invention

The present invention relates to a method and apparatus for converting a wide band audio signal into a series of discrete coded pulses and more particularly a method and means for converting such a signal into coded pulses with a result of having reduced noise and distortion errors.

The invention also relates to any analog-to-digital conversion application where maintaining inherent device accuracy is desired.

2. Description of the Prior Art

It has been demonstrated that instead of transmitting a continuous version of a signal containing intelligence, it is sufficient to sample the signal at regular discrete time intervals and to transmit the samples of the modulating signal in the form of a periodic pulse train which can be subsequently demodulated after transmission via a chosen medium.

Various pulse modulation methods have been used for years on voice grade and telex circuits because of several advantages; which include relative noise immunity, ease of multiplexing by interlacing pulses from two or more signal sources and the ease with which pulses can be reshaped with regenerative repeaters on long transmission circuits. In fact, pulse modulators/demodulators (MODEMS) are supplied to the wire services.

The requirement that the sampling frequency be at least twice the highest frequency in the signal source has limited application of pulse modulators to voice grade communications, teletype and data circuits whose upper frequency limit is about 4 kilohertz.

Digitizing high-fidelity audio material requires a greater degree of accuracy and resolution (14 to 16 bits) and also higher digitizing speed (less than 20 $\mu$sec per sample) in order to convert both channels of stereo with an upper cut off frequency of 20 kilohertz. 16 Bit analog-to-digital converters have become available in recent years, but they are very difficult to incorporate into a system in order to take full advantage of their inherent accuracy. In particular prior ADC's have been sensitive to impedance in the analog ground wiring from the ADC to a system ground point. This happens because voltage pulses are generated during the digitizing process due to fluctuating analog ground currents which flow through the wiring impedance. Since digitizing is a high-speed dynamic process, the presence of voltage pulses at the analog ground terminal of an ADC prevents the digitizing process from converging to the desired value. Further, when parasitic inductance exists in analog ground wiring, ringing in the voltage pulses prevents the digitizing process from converging to the same result when repeatedly digitizing the same input voltage. This lack of repeatability manifests itself as noise, an undesirable characteristic in any high resolution application.

It has been observed that wiring impedance in the analog ground can give rise to one or more of the following errors: noise or alternations (non-repeatability), increased linearity and differential linearity errors, shifts in offset and gain errors, missing output codes, hysteresis, and non-monotonicity. For a discussion of these errors in the literature, see "Testing Digital/Analog and Analog/Digital Converters" by Jim Naylor in IEEE Transactions on Circuits and Systems, July 1978. In high-quality PCM digital audio systems these errors cause increased distortion and noise.

Thus a need existed for an ADC which circumvents much of the wiring and layout restrictions that have been imposed upon the prior art.

SUMMARY OF THE INVENTION

This invention describes a system which digitizes wide-band analog input signals by using a high-speed 16 bit DAC which maintains high accuracy by being tolerant of extraneous wiring impedance in the analog ground between the device and a system analog ground point. This tolerance reduces both noise and distortion, a desirable feature in high resolution applications such as high quality PCM digital audio.

OBJECT OF THE INVENTION

Accordingly, it is an object of the present invention to provide a method and apparatus for periodically sampling an input electrical signal at a predetermined rate and generating a multibit binary number which accurately describes the input signal at the moment of sampling.

It is a further object of the invention to generate the desired sequence of binary words without having undue restrictions and precautions in wiring and layout, especially in the analog ground return.

BRIEF DESCRIPTION OF THE DRAWINGS

FIG. 4 is a block diagram and equation demonstrating the effect of changing analog ground currents.

FIG. 5 is a block diagram of the improved digital to analog converter.

FIG. 6 is a circuit diagram demonstrating the voltage reference and voltage reference ground buffer circuits shown in FIG. 4.

FIG. 7 is circuit diagram similar to that of FIG. 2 inlcuding the most significant bit ground buffer shown in FIG. 5.

DESCRIPTION OF THE PREFERRED EMBODIMENT

Figure 1:
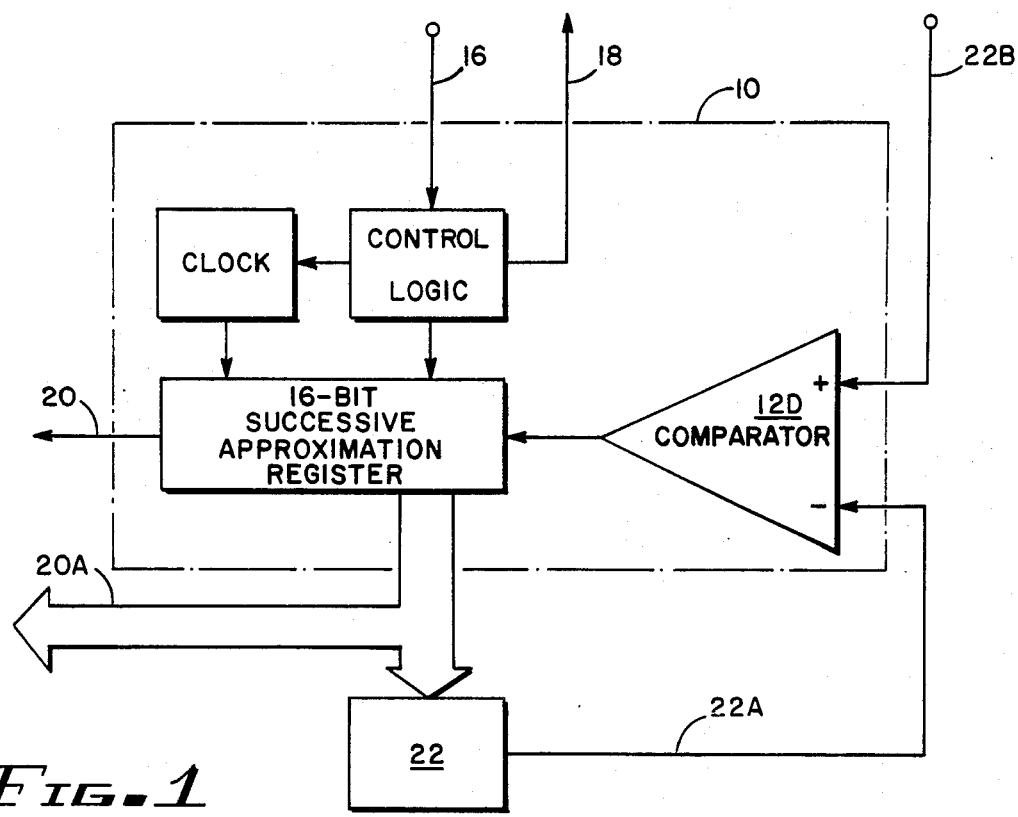
FIG. 1 is block schematic diagram of an analog-to-digital conversion system assembled and connected in accordance with this invention.
Figure 2:
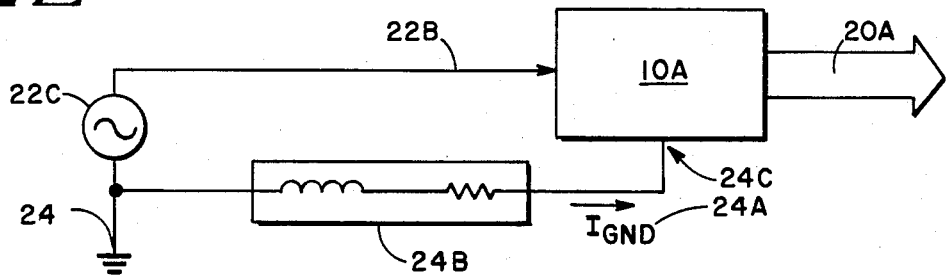
FIG. 2 illustrates the net circuit result of the components connected together in FIG. 1 and shows parasitic ground impedance from the analog-to-digital converter to a system analog ground point.

FIG. 1 shows a block diagram of the composite analog-to-digital converter (ADC) as shown as a single entity in FIG. 2. Block 10 contains components which control operation of the composite ADC; namely, a successive approximation register (SAR), a comparator, a clock circuit and control circuitry.

Control block 10 has three inputs and three outputs. Input 16 allows a start or initiate pulse to be entered into control block 10 so the successive approximation function can be started. Input 22B is from the analog input signal. Output 18 is to indicate the end of a conversion sequence which may indicate the need for an additional start pulse to input 16. Output 20 consists of a serial stream of binary bits generated by the SAR and parallel output 20A is the finished product of the composite ADC. Block 22 is an improved digital-to-analog converter (DAC) such as the DAC described in the referenced related copending patent application. Output 22A of DAC 22, coupled to the inverting input of comparator 12D, is a constructed analog voltage which ultimately equals the audio voltage connected to 22B coupled to the non-inverting input to comparator 12D.

In FIG. 2, block 10A includes all the components shown in FIG. 1. The audio frequency input shown at 22B is originating from generator 22C which is also connected to the system analog ground 24.

Referring to FIG. 4, when a bit is switched from an on to an off mode, a contribution by that bit to the current in analog ground 30 appears where there was previously not one. The changing value of the current flowing in analog ground 30 results in undesirable voltage errors at the output 22 of the DAC, when extraneous impedance 34 exists in analog ground as shown in FIG. 4. The equation in FIG. 4 demonstrates the effect of changing analog ground currents and the need to keep the magnitude of the analog ground current below a defined maximum amount, and also to keep analog ground current changes (when the bits are switched) below a maximum value.

The 16-bit DAC is represented by block 32. The output of the DAC 32 is shown at node 122 and represented by $V_o$. The analog circuit ground of the DAC is shown at node 30 with the current symbol $I_{gnd}$ representing the current which flows through the analog ground. In a usual application, whether at a testing or packaging stage by the manufacture, or being used by the customer, there will be a system ground 36 and some extraneous wiring, contact or packaging impedance 34, labeled $Z_{ext}$. The effect of an analog ground current $I_{gnd}$ is to alter the ideal voltage output of the DAC 32 by the amount equal to the product of $I_{gnd}$ and $Z_{ext}$, where $V_{DAC}$ (represented by a battery 32A) is the desired ideal output voltage of the DAC. Thus, the output voltage $V_o$ of the DAC 32 contains an error value of the ideal DAC output voltage $V_{DAC}$ node 122.

Referring to FIG. 5, a block diagram is shown which represents an improved digital to analog converter (DAC). The most significant bits (MSB) of the DAC are comprised of current switches and weighted current sources referenced generally by block 110. The least significant bits (LSB) of the DAC are comprised of indivivdual current switches and similarly weighted current sources, referenced by block 114, which are scaled by a primary resistance ladder referenced by block 116. The voltage reference for the MSB and LSB current source is supplied by a voltage reference circuit 112. The MSB current switches are controlled by 3 bits of a 16-bit digital control line. The LSB current switches are controlled by the remaining 13 bits of the same 16-bit digital control line. The outputs of the MSB current switches and current sources 110 and the output of the primary resistance ladder 116 are summed at the current summing node 118. The output current $I_o$ at node 118 is converted by op-amp 20 into the analog output voltage $V_o$ at output node 122.

The voltage reference circuit 112 has its analog ground current buffered by a voltage reference ground buffer 38. The MSB current switches and sources 110 has its analog ground current buffered by the MSB ground buffer circuit of block 40. A secondary resistance ladder 42 operates to reduce the change in the analog ground current by the alternating LSB current switches and current sources 114.

Referring to FIG. 6, a circuit is shown which functions as the voltage reference buffer 38 referenced above in FIG. 4. A conventional voltage reference circuit 112 is shown as being comprised of a voltage zener diode 44 having one end coupled to the negative supply $-V_s$. The other side of the zener diode 44 is coupled to the series connection of a plurality of compensation diodes, represented by diodes 46 and 50. The positive side of the last series diode 50 is coupled to a current source 52 and represents the biasing current $I_{vz}$ which is supplied to the compensation diodes 46 and 50 and the zener diode 44. The voltage across these diodes 44, 46, and 50 serve to bias the current sources in the MSB and LSB circuits 110 and 114.

A conventional voltage reference circuit would couple the positive side of current source 52 to the analog ground 30. However, to reduce unwanted current in the analog ground, the positive side of current source 52 is coupled to the emitter of transistor 54 which comprises part of buffer 38. The base of transistor 54 is coupled to analog ground. The collector of transistor 54 is coupled to the positive supply $+V_s$. Thus, the majority of current flowing through voltage reference 12 originates from $+V_s$ and not from the analog ground. The result is to reduce the contribution of the current $I_z$ that flows in analog ground to an amount equal to $I_z$ that flows in analog ground to an amount equal to $I_z$ divided by the current gain (Beta) of transistor 54.

Referring to FIG. 7, a circuit is shown which functions as the MSB ground buffer 40 shown in FIG. 5. However, the collector of transistor 126 of current switch 111 is not coupled to analog ground. Instead, the collector of transistor 126 is coupled to the emitter of transistor 56 of most significant bit ground buffer 40. The collector of transistor 56 is coupled to the positive voltage supply. Thus, a majority of the current $I_w$ which flows through transistor 126 when it is turned on originates from the positive supply $+V_s$ at the collector of transistor 56.

The amount of current $I_1$ flowing in the base of transistor 56 is equal to the weighted current $I_w$ divided by the beta of transistor 56. To further isolate the analog ground 30 from the effects of the switching current sources, a second transistor 58 (which is a PNP transistor) is used to further divide the current $I_1$. The base of transistor 56 is coupled to the emitter to transistor 58. The emitter of transistor 58 is similarly biased by a current source $I_{bias}$. The collector of transistor 58 is coupled to the negative supply $-V_s$. The contribution of current $I_2$ (which is due to $I_w$) flowing from analog ground is equal to the weighted current $I_w$ divided by the produce of the betas of transistor 58 and the beta of transistor 56.

One of the effects of the MSB ground buffer 40 is to reduce the amount of current flowing from analog ground through the plurality of MSB current switches (only one of which is shown). As a result, the amount of fluctuation in the analog ground current when the transistors 124 and 126 are switching on and off is reduced. In addition, by using a PNP transistor 58 and an NPN transistor 56 combination, the voltage at the collector of transistor 126 when it is turned on is the sum of the base to emitter voltages from transistor 58 and 56. Thus, the emitter of transistor 56 is at approximately ground potential. The voltage at the collector of transistor 24 is simularly approximately zero volts, because the voltage differential between + and − inputs of amplifier 120 will be zero, since the + input is tied to analog ground. Since the collectors of both transistors 124 and 126 are at the same voltage they dissipate the same amount of power when turned on. As a result the current source 113 (which is affected by the thermally generated heat of the nearby transistor switches 124 and 126) will be affected equally by transistor switches 124 and 126 since they each dissipate the same power when turned on, thus another potential source of error is reduced.

The voltage reference circuit 12 sets up the biasing voltage for the current switches of both the MSB and the LSB circuits. In addition, voltage reference buffer 38 operates to reduce the analog ground 30 from the zener biasing current $I_z$ by pulling most of the current from the positive supply $+V_s$.

Output of block 10A which is a digitized bit stream based on the analog input 22B is shown at 20A. Block 10A includes the collection of components shown in FIG. 1, the most important of which is 22, the improved DAC described in the copending application "A Circuit for Improving the Performance of Digital to Analog Converters". A conventional ADC has switching currents in the DAC analog ground which give rise to voltage pulses that are a source of output error especially at the cross-over points when the input signal goes through zero. Referring to FIG. 2 it can be seen that the actual input signal to the ADC (10A) is the signal that occurs between points 22B, the analog input, and 24C the analog ground terminal of the ADC (which is also the analog ground terminal of the internal DAC shown in FIG. 1 as block 22). Therefore the actual input signal is the sum of the signal source 22C and the drop across the external wiring impedance 24B. Thus the drop across the external wiring impedance 24B is an undesirable error source. Due to the dynamic nature of the successive approximation process, a substantial error signal can be generated especially when the wiring impedance contains parasitic inductance.

By using the improved DAC, changes in analog ground current 24A are held to a sufficiently small level to prevent input/output transfer function errors (such as described under the prior art section and shown in FIG. 3) from occurring. It is important to minimize these errors, especially in applications such as PCM audio, because these errors are a source of distortion and noise. Errors created when the input signal crosses zero are particularly undesirable for a low level input signal as the magnitude of the errors will be a much larger percentage of a low level signal than they would be of a higher level signal.

Figure 3:
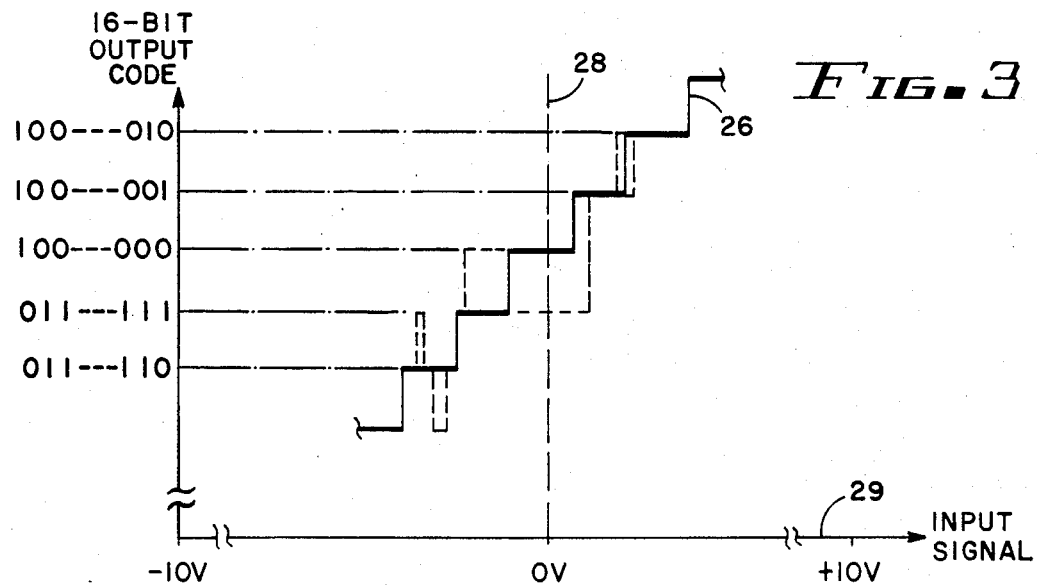
FIG. 3 shows an enlarged view of the input/output transfer function of the ADC at the point where the signal crosses the zero axis and changes polarity from negative to positive. This zero crossing is a particularly sensitive portion of the input/output transfer function.

The solid lines in FIG. 3 show a typical (and near ideal) input/output transfer function 26 of the improved ADC even when external wiring impedance (24B in FIG. 2) is not reduced to a minimal amount (such as is required for acceptable performance from a conventional ADC). Shown in the figure are the mid-scale transitional codes of the input signal 29 crossing the zero voltage axis 28. The dotted lines on the transfer function are typical of the errors (as discussed in the prior arts section) that are generated when an ADC with a conventional DAC is operated in a system containing analog ground wiring impedance 24B.

While the invention has been described with respect to a preferred physical embodiment constructed in accordance therewith, it will be apparent to those skilled in the art that various modifications and improvements may be made without departing from the scope and spirit of the invention. For example, the number of bits in the ADC can be more or less than 16. Further, applications are not restricted to high-quality digital PCM audio. A 16-bit digital counter can be substituted for the 16-bit successive approximation register.

What is claimed is:

1. An analog to digital converter comprising:
   digital to analog converter means for providing a constructed analog signal representative of a digital input signal, said digital to analog converter means comprises
   most significant bit current switches and sources;
   least significant bit current switches and sources;
   a primary resistance network coupled to said least significant bit current switches and sources and to a ground terminal, said primary resistance network having an output coupled to said most significant bit current switches, each of said least significant bit current switches and sources applying current to said primary resistance network when said each least significant bit current switches and sources are in a first state;
   most significant bit ground buffer means coupled to said most significant bit current switches and sources for reducing a current flowing from analog ground through said most significant bit current switches; and
   secondary resistance network means coupled to said least significant bit current switches and sources and to said ground terminal, each of said least significant bit current switches and sources applying current to said secondary resistance means, said secondary resistance network means for providing an analog ground current contribution when said each least significant bit current switch and source is in a second state
   generally equal to an analog ground current contribution;
   compensation means coupled to selected current switches and sources for replacing at least a portion of analog ground current flowing from analog ground through said selected current switches with current flowing from a power supply when said selected current switches are in a conducting state and for substantially eliminating said analog ground current flowing through said selected current switches when said selected current switches are in a non-conducting state;
   generation means for generating clock pulses;
   register means for providing to said digital to analog converter means a parallel group of logic signals representative of the number of clock pulses generated during an interval of time, said register means including a successive approximation register;

comparator means for comparing said constructed analog signal with an audio input signal, said comparator means providing a known signal during said interval determined by a relative signal strength between said constructed and said audio input signal, said parallel group of logic signals being representative of the output of said register means cleared in response to an initiate pulse at the beginning of said interval.

* * * * *